United States Patent
Suzuki et al.

(10) Patent No.: US 9,384,974 B2
(45) Date of Patent: Jul. 5, 2016

(54) TRENCH FILLING METHOD AND PROCESSING APPARATUS

(71) Applicant: TOKYO ELECTRON LIMITED, Tokyo (JP)

(72) Inventors: Daisuke Suzuki, Yamanashi (JP); Kazuya Takahashi, Yamanashi (JP); Mitsuhiro Okada, Yamanashi (JP); Katsuhiko Komori, Yamanashi (JP); Satoshi Onodera, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 42 days.

(21) Appl. No.: 14/285,874

(22) Filed: May 23, 2014

(65) Prior Publication Data

US 2014/0349468 A1  Nov. 27, 2014

(30) Foreign Application Priority Data

May 27, 2013  (JP) ................. 2013-110738

(51) Int. Cl.
*H01L 21/02* (2006.01)

(52) U.S. Cl.
CPC ...... *H01L 21/02532* (2013.01); *H01L 21/0245* (2013.01); *H01L 21/02502* (2013.01); *H01L 21/02592* (2013.01); *H01L 21/02645* (2013.01); *H01L 21/02667* (2013.01)

(58) Field of Classification Search
CPC .............. H01L 21/02532; H01L 21/0245; H01L 21/02381
USPC ................................. 438/478–509
See application file for complete search history.

(56) References Cited

U.S. PATENT DOCUMENTS

| | | | |
|---|---|---|---|
| 5,371,039 A * | 12/1994 | Oguro | 438/396 |
| 6,432,772 B1 * | 8/2002 | Wu et al. | 438/255 |
| 7,109,097 B2 * | 9/2006 | Paranjpe et al. | 438/510 |
| 7,118,956 B2 * | 10/2006 | Kito et al. | 438/243 |
| 2004/0070018 A1 * | 4/2004 | Keeth et al. | 257/300 |
| 2004/0213907 A1 * | 10/2004 | Todd et al. | 427/255.18 |
| 2005/0176194 A1 * | 8/2005 | Sasaki et al. | 438/197 |
| 2006/0046364 A1 * | 3/2006 | Chang et al. | 438/197 |
| 2011/0312192 A1 * | 12/2011 | Murakami et al. | 438/787 |

FOREIGN PATENT DOCUMENTS

| | | |
|---|---|---|
| JP | 62-108541 | 5/1987 |
| JP | 01-205525 | 8/1989 |
| JP | 04-003420 | 1/1992 |
| JP | 06-085081 | 3/1994 |
| JP | 10-056154 | 2/1998 |
| JP | 2000-150830 A | 5/2000 |

* cited by examiner

*Primary Examiner* — Karen Kusumakar
(74) *Attorney, Agent, or Firm* — Nath, Goldberg & Meyer; Jerald L. Meyer

(57) ABSTRACT

The present disclosure provides a method for filling a trench formed on an insulating film of a workpiece. The method includes forming a first impurity-containing amorphous silicon film on a wall surface which defines the trench, forming a second amorphous silicon film on the first amorphous silicon film, and annealing the workpiece after the second amorphous silicon film is formed.

5 Claims, 4 Drawing Sheets

TRENCH FILLING METHOD AND PROCESSING APPARATUS

CROSS-REFERENCE TO RELATED APPLICATION

This application claims the benefit of Japanese Patent Application No. 2013-110738, filed on May 27, 2013, in the Japan Patent Office, the disclosure of which is incorporated herein in its entirety by reference.

TECHNICAL FIELD

The present disclosure relates to a trench filling method and a processing apparatus.

BACKGROUND

In the manufacture of a device such as a semiconductor device or the like, a process of filling silicon into a trench formed on an insulating film is performed. The silicon filled into the trench can be used as, e.g., an electrode.

In a process of the related art, a polycrystalline silicon film is formed on a wall surface of a workpiece, that define the trench. Subsequently, an amorphous silicon film is formed on the polycrystalline silicon film. Thereafter, the workpiece is annealed. In this process, by annealing the workpiece, amorphous silicon is moved toward the bottom portions of the trench, whereby the trenches are filled with the amorphous silicon.

However, the polycrystalline silicon film has a problem in that the flatness of the surface thereof is low. Since the growth of the polycrystalline silicon film is performed at a relatively high temperature, the polycrystalline silicon film has a large stress due to the thermal hysteresis. For that reason, a stress difference in an interface between the polycrystalline silicon film and the amorphous silicon film grows larger. The amorphous silicon becomes less fluid during the annealing due to the stress difference and the low flatness. As a result, cavities called voids or seams are formed in the silicon film that fills the trenches.

SUMMARY

Some embodiments of the present disclosure provide a method and an apparatus that can suppress generation of cavities when filling trenches.

According to one embodiment of the present disclosure, provided is a method for filling a trench formed on an insulating film of a workpiece, including forming a first impurity-containing amorphous silicon film on a wall surface which defines the trench, forming a second amorphous silicon film on the first amorphous silicon film, and annealing the workpiece after the second amorphous silicon film is formed.

According to another embodiment of the present disclosure, provided is a processing apparatus including a vessel, a gas supply unit configured to supply a first gas for forming a first impurity-containing amorphous silicon film and a second gas for forming a second amorphous silicon film, into the vessel, a heating unit configured to heat an internal space of the vessel, and a control unit configured to control the gas supply unit and the heating unit. The control unit may be further configured to perform a first control operation by which the gas supply unit is controlled so as to supply the first gas into the vessel and by which the heating unit is controlled so as to heat the internal space of the vessel. Further, the control unit may be configured to, after performing the first control operation, perform a second control operation by which the gas supply unit is controlled so as to supply the second gas into the vessel and by which the heating unit is controlled so as to heat the internal space of the vessel. The control unit may be further configured to, after performing the second control operation, perform a third control operation by which the heating unit is controlled so as to heat the internal space of the vessel.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the drawings, identical or equivalent parts will be designated by like reference symbols.

Figure 1:
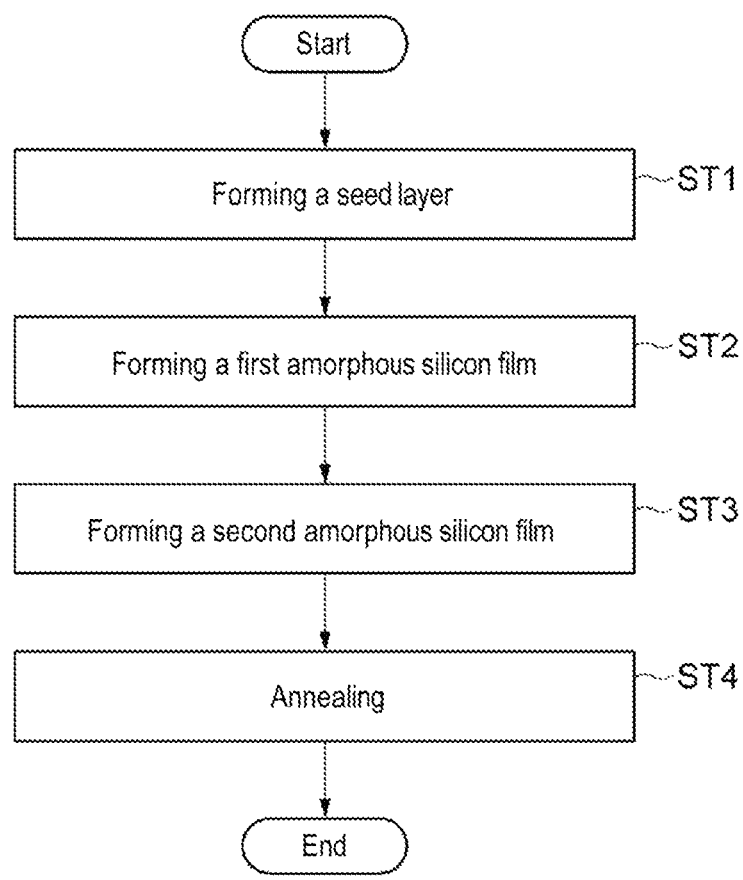
FIG. 1 is a flowchart illustrating a trench filling method according to one embodiment.

FIG. 1 is a flowchart illustrating a trench filling method according to one embodiment. FIGS. 2A to 2E are views illustrating the states of a workpiece which has been subjected to the respective steps of the method shown in FIG. 1. In FIGS. 2A to 2E, there are shown partially-enlarged sectional views of a workpiece. In the method shown in FIG. 1, an amorphous silicon flows into a trench of a workpiece, thereby filling the bottom portion of the trench with the amorphous silicon.

Figure 2A:
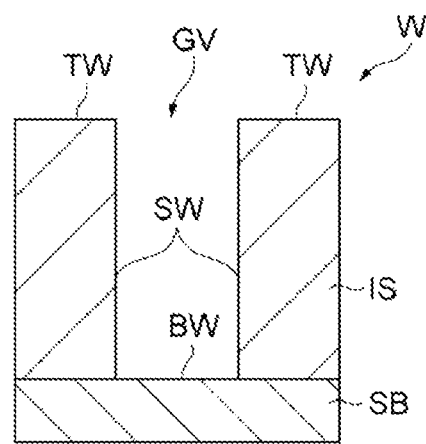
FIGS. 2A to 2E are views illustrating the states of a workpiece which has been subjected to respective steps of the method shown in FIG. 1.

As shown in FIG. 2A, a workpiece (hereinafter referred to as a "wafer") W includes a substrate SB and an insulating film IS. The substrate SB is, e.g., a silicon-made substrate. The insulating film IS is formed on the substrate SB. The insulating film IS is formed of, e.g., $SiO_2$ or SiN. A trench GV is formed in the insulating film IS. The trench GV can be formed by, e.g., etching the insulating film IS using a mask.

The trench filling method according to one embodiment includes a sequence of steps ST2, ST3 and ST4 which are performed with respect to the wafer W. In this embodiment, step ST1 is carried out prior to step ST2. Step ST1 is to form a seed layer. Step ST2 is to form a first amorphous silicon film which contains impurities. Step ST3 is to form a second amorphous silicon film. Step ST4 is to anneal the wafer W.

Figure 3:
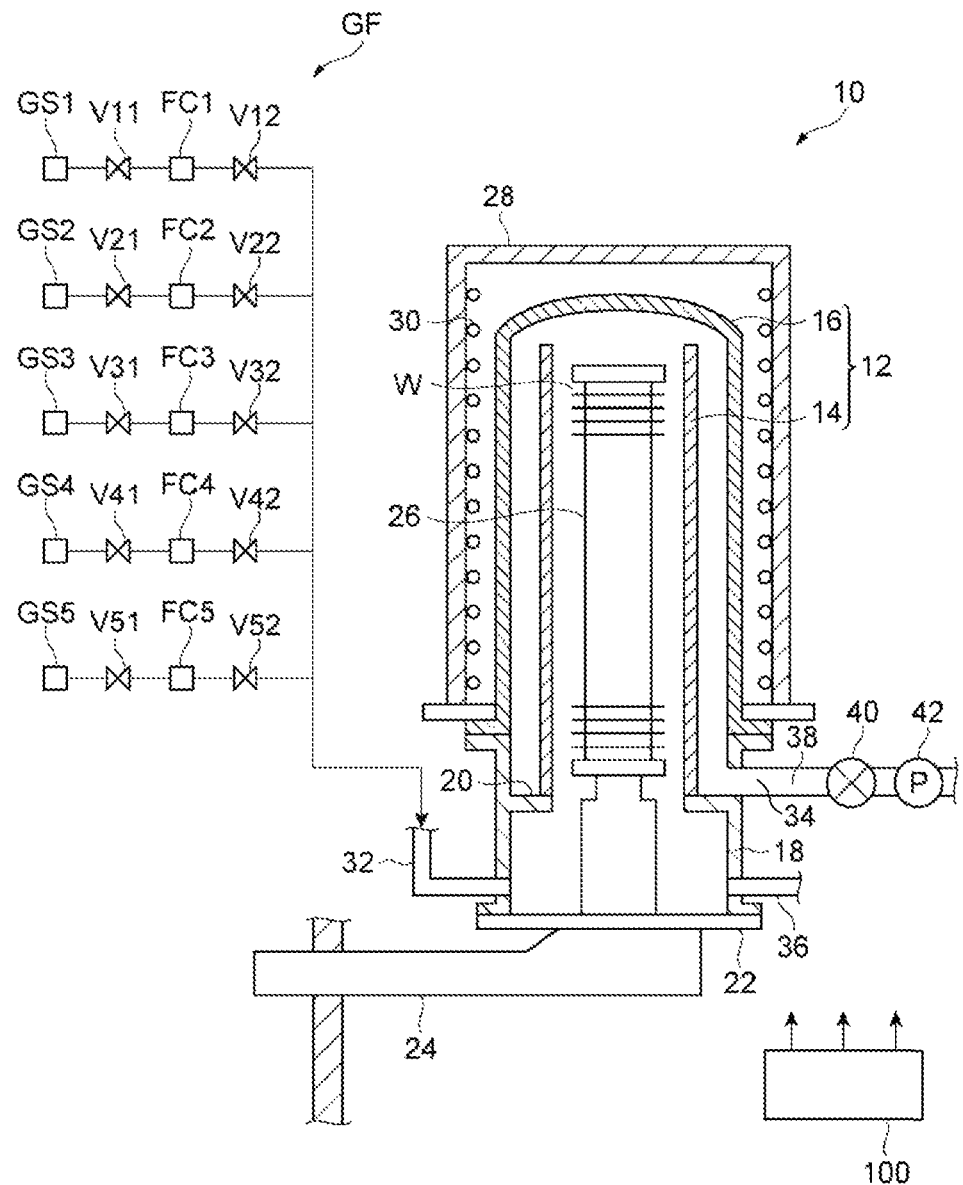
FIG. 3 is an illustrative view schematically showing a processing apparatus which can be used in implementing a trench filling method according to one embodiment.

A description will now be provided on one example of a processing apparatus that can be used in implementing steps ST1 to ST4. FIG. 3 is an illustrative view schematically showing the processing apparatus which can be used in implementing the trench filling method according to one embodiment. In some embodiments, the sequence of steps ST1 to ST4 may be implemented by other processing apparatuses.

The processing apparatus 10 shown in FIG. 3 includes a vessel 12. The vessel 12 is a reaction tube having a substantially cylindrical shape. The longitudinal direction of the vessel 12 is oriented in the vertical direction. The vessel 12 has a double tube structure and includes an inner tube 14 and an outer tube 16. The inner tube 14 and the outer tube 16 are made of a material superior in heat resistance and corrosion resistance, e.g., quartz.

The inner tube 14 has a substantially cylindrical shape with an upper end and a lower end. The upper and lower ends of inner tube 14 are opened. The outer tube 16 is installed in a substantially coaxial relationship with the inner tube 14 so as to cover the inner tube 14. There is a pre-specified gap between the inner tube 14 and outer tube 16. An upper end of the outer tube 16 is closed and a lower end of the outer tube 16 is opened.

A manifold 18 is installed below the outer tube 16. The manifold 18 is formed in a tubular shape and is made of, e.g., a stainless steel (SUS). The manifold 18 is air-tightly connected to the lower end of the outer tube 16. A support ring 20 is installed to protrude inward from the inner wall of manifold 18. The support ring 20 is integrally formed with the manifold 18 and supports the inner tube 14.

A lid 22 is installed below the manifold 18. The lid 22 is connected to a boat elevator 24 and can be moved up and down by the boat elevator 24. If the lid 22 is moved up by the boat elevator 24, a lower opening (namely, throat portion) of the manifold 18 is closed. On the other hand, if the lid 22 is moved down by the boat elevator 24, the lower opening (namely, throat portion) of the manifold 18 is opened.

A wafer boat 26 is mounted on the lid 22. The wafer boat 26 is made of, e.g., quartz. The wafer boat 26 is configured to hold a plurality of wafers W with a pre-specified gap between each wafer.

A heat insulating body 28 is installed around the vessel 12 so as to surround the vessel 12. Heaters (or heating units) 30 are installed on the inner wall surface of the heat insulating body 28. The heaters 30 are composed of, e.g., resistance heating elements. The interior of the vessel 12 is heated to a specified temperature by the heaters 30. Thus, the wafers W are heated to a predetermined temperature.

At least one gas introduction pipe 32 is connected to the sidewall of the manifold 18. For example, the gas introduction pipe 32 is connected to the sidewall of the manifold 18 at a position lower than the support ring 20. A gas line formed by the gas introduction pipe 32 communicates with the interior of the vessel 12.

A gas supply unit GF is connected to the gas introduction pipe 32. In one embodiment, the gas supply unit GF includes gas sources GS1, GS2, GS3, GS4 and GS5, valves V11, V12, V21, V22, V31, V32, V41, V42, V51 and V52, and flow rate controllers FC1, FC2, FC3, FC4 and FC5 such as mass flow controllers or the like. The gas source GS1 is connected to the gas introduction pipe 32 through the valve V11, the flow rate controller FC1 and the valve V12. The gas source GS2 is connected to the gas introduction pipe 32 through the valve V21, the flow rate controller FC2 and the valve V22. The gas source GS3 is connected to the gas introduction pipe 32 through the valve V31, the flow rate controller FC3 and the valve V32. The gas source GS4 is connected to the gas introduction pipe 32 through the valve V41, the flow rate controller FC4 and the valve V42. The gas source GS5 is connected to the gas introduction pipe 32 through the valve V51, the flow rate controller FC5 and the valve V52.

The gas source GS1 is a source of supplying a raw gas used in forming a seed layer in step ST1. The gas source GS1 may supply, e.g., an aminosilane-based gas. Examples of the aminosilane-based gas may include BAS (butylaminosilane), BTBAS (bis(tertiary-butylamino) silane), DMAS (dimethylaminosilane), BDMAS (bis(dimethylamino)silane), TDMAS (tri(dimethylamino)silane), DEAS (diethylaminosilane), BDEAS (bis(diethylamino)silane), DPAS (dipropylaminosilane), or DIPAS (diisopropylaminosilane). Furthermore, an aminodisilane gas may be used as the aminosilane-based gas. Moreover, the gas source GS1 may be a source of a high-order silane gas such as a disilane gas, a trisilane gas, a tetrasilane gas or the like. In some embodiments, examples of the aminosilane-based gas may include diisopropylaminodisilane $(Si_2H_5N(iPr)_2)$, diisopropylaminotrisilane $(Si_3H_7N(iPr)_2)$, diisopropylaminodichlorosilane $(Si_2H_4ClN(iPr)_2)$, or diisopropylaminotrichlorosilane $(Si_3H_6ClN(iPr)_2)$.

The gas source GS2 is a source of a silicon raw gas that can be used in forming the first amorphous silicon film in step ST2 and in forming the second amorphous silicon film in step ST3. In some embodiments, the gas source GS2 may be a source of a monosilane gas, a disilane gas or the aforementioned aminosilane-based gas. In some embodiments, the first amorphous silicon film and the second amorphous silicon film may be formed by different gases which are supplied from different gas sources.

The gas source GS3 is a source of a gas which is used to dope an impurity to the first amorphous silicon film in step ST2. Examples of the impurity include arsenic (As), boron (B) and phosphorus (P). Examples of an impurity-doping gas may include phosphine $(PH_3)$, diborane $(B_2H_6)$, boron trichloride $(BCl_3)$, or arsine $(AsH_3)$.

The gas source GS4 is a source of an additional gas that can be used in forming the first amorphous silicon film in step ST2 and in forming the second amorphous silicon film in step ST3. Examples of the additional gas may include a $C_2H_4$ gas, a $N_2O$ gas, a NO gas and a $NH_3$ gas. In some embodiments, one or more of the $C_2H_4$ gas, the $N_2O$ gas, the NO gas and the $NH_3$ gas may be used as the additional gas.

The gas source GS5 is a source of another additional gas that can be used in the annealing of step ST4. Example of the another additional gas may include an inert gas such as a hydrogen gas or a nitrogen gas.

As shown in FIG. 3, an exhaust port 34 through which a gas existing within the vessel 12 is exhausted, is formed in the side surface of the manifold 18. The exhaust port 34 is arranged above the support ring 20 and is in communication with the space formed between the inner tube 14 and the outer tube 16 of the vessel 12. Accordingly, an exhaust gas generated within the inner tube 14 flows toward the exhaust port 34 through the space formed between the inner tube 14 and the outer tube 16.

Furthermore, a purge gas supply pipe 36 is connected to the manifold 18. The purge gas supply pipe 36 is connected to the manifold 18 below the exhaust port 34. The purge gas supply pipe 36 is connected to a purge gas supply source (not shown). A purge gas (e.g., nitrogen gas) which is supplied from the purge gas supply source, is supplied into the vessel 12 through the purge gas supply pipe 36.

An exhaust pipe 38 is air-tightly connected to the exhaust port 34. From the upstream side of the exhaust pipe 38, a valve 40 and an exhaust unit 42 such as a vacuum pump or the like are installed. The valve 40 adjusts an opening degree of the exhaust pipe 38, thereby controlling an internal pressure of vessel 12 at a predetermined pressure. The exhaust unit 42 evacuates gas from the vessel 12 through the exhaust pipe 38 and adjusts the internal pressure of the vessel 12. In some embodiments, a trap, a scrubber, and so forth may be installed in the exhaust pipe 38 to detoxify the exhaust gas discharged from the vessel 12 before the exhaust gas is exhausted out of the processing apparatus 10.

Figure 4:
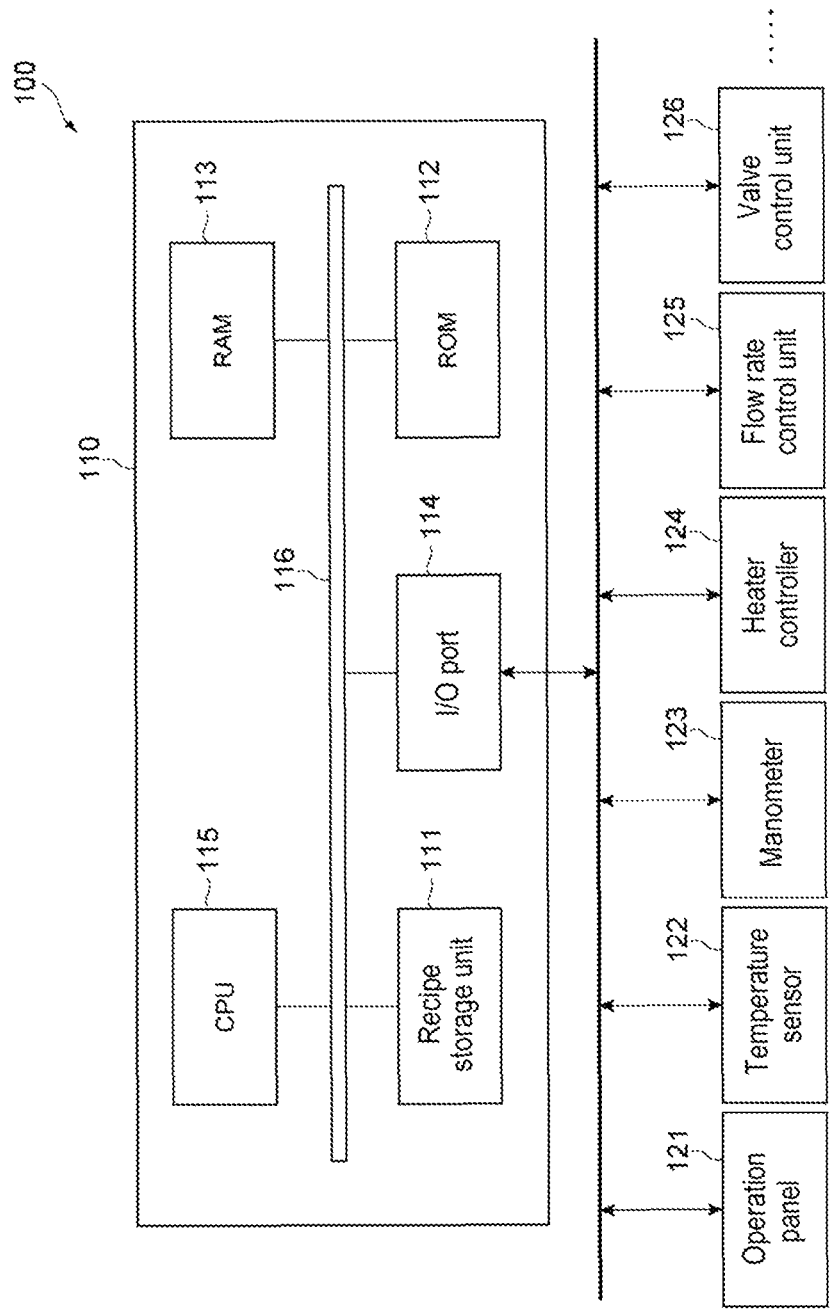
FIG. 4 is an illustrative view showing a configuration of a control unit of the processing apparatus shown in FIG. 3.

The processing apparatus 10 further includes a control unit 100 configured to control individual units or parts of the processing apparatus 10. FIG. 4 shows the configuration of the control unit 100. As shown in FIG. 4, the control unit 100 includes a main control unit 110. An operation panel 121, a temperature sensor (group) 122, a manometer (group) 123, a heater controller 124, a flow rate control unit 125, a valve control unit 126, and so forth are connected to the main control unit 110.

The operation panel 121 includes a display screen and operation buttons and delivers an operator's operation instruction to the main control unit 110. Furthermore, the operation panel 121 allows the display screen to display various types of information transmitted from the main control unit 110.

The temperature sensor (group) 122 measures internal temperatures of each of the vessel 12, the gas introduction pipe 32, the exhaust pipe 38 and the like, and notifies the measured temperature values to the main control unit 110. The manometer (group) 123 measures internal pressures of each of the vessel 12, the gas introduction pipe 32, the exhaust pipe 38 and the like, and notifies the measured pressure values to the main control unit 110.

The heater controller 124 is configured to individually control the heaters 30. In response to the instruction transmitted from the main control unit 110, the heater controller 124 supplies electric power to the heaters 30, thereby causing the heaters 30 to generate heat. Moreover, the heater controller 124 individually measures a power consumption of the heaters 30 and notifies the measured power consumption to the main control unit 110.

The flow rate control unit 125 controls the flow rate controllers FC1 to FC5 of the gas supply unit GF such that the flow rates of the gases flowing through the gas introduction pipe 32 become equal to the flow rates instructed by the main control unit 110. Moreover, the flow rate control unit 125 measures flow rates of the gases actually flowing through the gas introduction pipe 32 and reports the measured flow rate values to the main control unit 110. The valve control unit 126 controls opening degrees of the valves arranged in the respective pipes according to values instructed by the main control unit 110.

The main control unit 110 includes a recipe storage unit 111, a ROM 112, a RAM 113, an I/O port 114, a CPU 115 and a bus 116 which interconnects the recipe storage unit 111, the ROM 112, the RAM 113, the I/O port 114 and the CPU 115.

A setup recipe and a plurality of process recipes are stored in the recipe storage unit 111. The recipe storage unit 111 only stores the setup recipe when the processing apparatus is initially manufactured. The setup recipe is executed to generate a thermal model or the like corresponding to different processing apparatuses. The process recipes are prepared for each individual process which is actually performed pursuant to the user's desire. For example, the process recipes define a variation in temperature in the respective areas, a variation in the internal pressure of the vessel 12, the start and stop timing for supplying the processing gas, and the supply amount of the processing gas from the time at which the wafers W are loaded into the vessel 12 to the time at which the processed wafers W are unloaded from the vessel 12.

The ROM 112 may be any type of non-volatile memory, such as an EEPROM, a flash memory, a hard disk or the like. The ROM 112 is a storage medium for storing an operation program of the CPU 115. The RAM 113 serves as a work area of the CPU 115.

The I/O port 114 is connected to the operation panel 121, the temperature sensor (group) 122, the manometer (group) 123, the heater controller 124, the flow rate control unit 125 and the valve control unit 126. The I/O port 114 controls the input and output of data or signals.

The CPU (Central Processing Unit) 115 is the core of the main control unit 110 and executes the control program stored in the ROM 112. In response to the instructions transmitted from the operation panel 121, the CPU 115 controls the operation of the processing apparatus 10 depending on the recipes (process recipes) stored in the recipe storage unit 111. The CPU 115 controls the temperature sensor (group) 122, the manometer (group) 123 and the flow rate control unit 125 to respectively measure the temperatures, the pressures and the flow rates within the vessel 12, the gas introduction pipe 32 and the exhaust pipe 38. Based on these measured data, the CPU 115 outputs control signals to the heater controller 124, the flow rate control unit 125 and the valve control unit 126 and controls the respective units or parts pursuant to the process recipes. The bus 116 transmits information between the respective units or parts.

Hereinafter, the aforementioned trench filling method that can be implemented by the processing apparatus 10 configured as above will be described in more detail with reference to FIGS. 1 and 2.

Figure 2D:
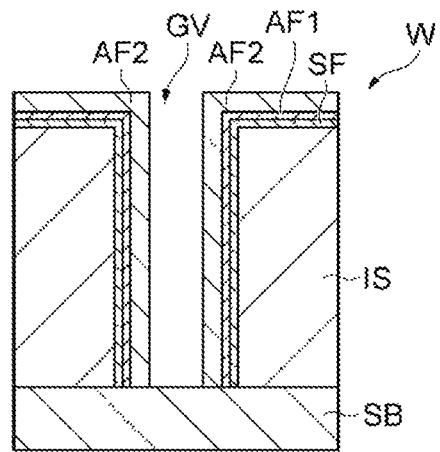
Figure 2B:
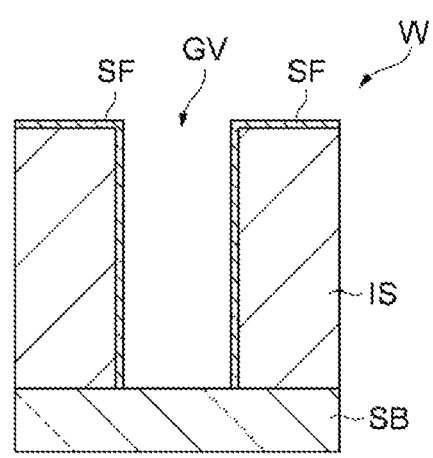

In step ST1, as shown in FIGS. 1 and 2B, a seed layer SF is formed on wall surfaces that define the trench GV. The seed layer SF is formed to have a thickness of, e.g., 0.1 nm, so as not to occlude the trench GV. The wall surface, on which the seed layer SF is formed, includes side wall surfaces SW of the trench GV and a bottom surface BW of the trench GV. The seed layer SF is also formed on a top surface TW of the insulating film IS.

In step ST1, in order to form the seed layer SF, a predetermined flow rate of a raw gas such as the aminosilane-based gas or the high-order silane gas is supplied into the vessel 12 in which the wafers W are accommodated. The internal pressure and temperature of the vessel 12 are set to predetermined values. In some embodiments, in step ST1, the predetermined flow rate of the raw gas may be set to fall within a predetermined range of, e.g., from 10 sccm to 500 sccm. Further, the internal pressure of the vessel 12 may be set to fall within a predetermined range of, e.g., from 0.1 Torr (13.33 Pa) to 10 Torr (1333 Pa). Further, the internal temperature of the vessel 12 may be set to fall within a predetermined range of, e.g., from 300 degrees C. to 600 degrees C.

To perform step ST1 in the processing apparatus 10, the control unit 100 performs a control operation (a fourth control operation) to be described below. In this control operation, the control unit 100 controls the valve V11, the flow rate controller FC1 and the valve V12 so that the raw gas can be supplied from the gas source GS1 is flown into the vessel 12 at a specified flow rate. Further, the control unit 100 controls the exhaust unit 42 so that the internal pressure of the vessel 12 becomes equal to a predetermined pressure. Further, the control unit 100 controls the heaters 30 so that the internal temperature of the vessel 12 becomes equal to a predetermined temperature.

The seed layer SF is formed as a single layer by the aminosilane-based gas or the high-order silane gas but is not limited thereto. In some embodiments, the seed layer SF may be formed by forming a first silicon-containing layer through the adsorption or deposition of the aminosilane-based gas on the surfaces SW and TW of the trench GV and the insulating film IS and subsequently, forming a second silicon-containing layer on the first silicon-containing layer through the use of the high-order silane gas.

Figure 2E:
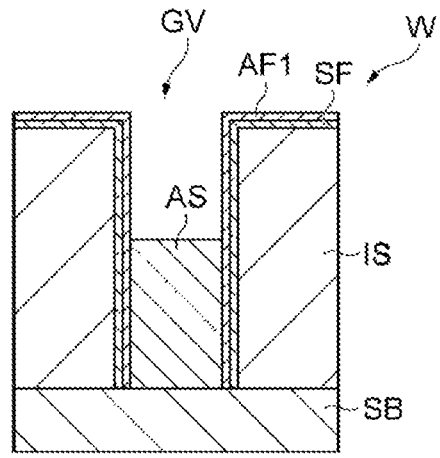
Figure 2C:
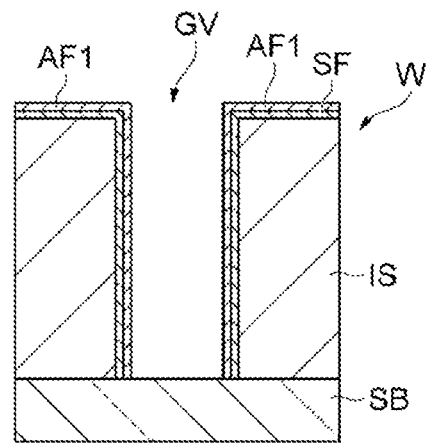

Subsequently, step ST2 is performed in the trench filling method. In step ST2, as shown in FIG. 2C, a first amorphous silicon film AF1 containing an impurity is formed on the wall surfaces SW that defines the trench GV. The first amorphous silicon film AF1 is formed to have a thickness of, e.g., from 0.5 nm to 10 nm, so as not to occlude the trench GV. While the first amorphous silicon film AF1 has been shown to be formed on the seed layer SF in FIG. 2C, the first amorphous silicon film AF1 may be directly formed on the side wall surfaces SW, the bottom surface BW and the top surface TW.

The first amorphous silicon film AF1 is an amorphous silicon film doped with an impurity. The term "impurity" refers to an atom which is bonded to Si to generate an electron or a positive hole. For example, the impurity may be B, P or As atom. In order to form the first amorphous silicon film AF1 having the doped impurity, in step ST2, a first gas is supplied into the vessel 12 which accommodates the wafers W. In some embodiments, a silicon raw gas or an impurity-doping gas may be supplied into the vessel 12 at a specific flow rate as the first gas. In step ST2, the internal pressure and temperature of the vessel 12 is set to predetermined values. The raw gas supplied in step ST2 may be, e.g., a monosilane gas, a disilane gas or the aforementioned aminosilane-based gas. The raw gas is supplied into the vessel 12 at a flow rate of, e.g., from 50 sccm to 5000 sccm. The impurity-doping gas may be, e.g., phosphine ($PH_3$), diborane ($B_2H_6$), boron trichloride ($BCl_3$), or arsine ($AsH_3$). The impurity-doping gas is supplied into the vessel 12 at a flow rate of, e.g., from 1 sccm to 1000 sccm. In step ST2, the internal pressure of the vessel 12 is set at a pressure of, e.g., from 0.1 Torr (13.33 Pa) to 10 Torr (1333 Pa). The internal temperature of the vessel 12 is set at a temperature of, e.g., from 300 degrees C. to 600 degrees C.

In some embodiments, in step ST2, an additional gas including one or more of a $C_2H_4$ gas, a $N_2O$ gas, a NO gas and a $NH_3$ gas may be supplied into the vessel 12. A flow rate of the additional gas may be set, for example at, 5 sccm to 1000 sccm.

To perform step ST2 in the processing apparatus 10, the control unit 100 executes a control operation (a first control operation) to be described below. In this control operation, the control unit 100 controls the valve V21, the flow rate controller FC2 and the valve V22 so that the raw gas can be supplied from the gas source GS2 into the vessel 12 at a specified flow rate. Further, the control unit 100 controls the valve V31, the flow rate controller FC3 and the valve V32 so that an impurity-doping gas can be supplied from the gas source GS3 into the vessel 12 at a specified flow rate. Further, the control unit 100 controls the exhaust unit 42 to set the internal pressure of the vessel 12 at a predetermined pressure. Further, the control unit 100 controls the heaters 30 to set the internal temperature of the vessel 12 at a predetermined temperature. Further, in step ST2, the control unit 100 controls the valve V41, the flow rate controller FC4 and the valve V42 so that the additional gas can be supplied from the gas source GS4 into the vessel 12 at a specified flow rate.

Subsequently, step ST3 is performed in the trench filling method. In step ST3, as shown in FIG. 2D, the second amorphous silicon film AF2 is formed on the first amorphous silicon film AF1. The second amorphous silicon film AF2 is formed so as not to occlude the trench GV. A thickness of the second amorphous silicon film AF2 may be appropriately set depending on a dimension of the trench GV and the amount of the amorphous silicon to be filled into the trench GV.

In step ST3, in order to form the second amorphous silicon film AF2, a second silicon gas is supplied into the vessel 12 which accommodates the wafers W. Specifically, a silicon raw gas may be supplied into the vessel 12 at a specified flow rate. In step ST3, the internal pressure and the internal temperature of the vessel 12 are set at predetermined values. Examples of the raw gas supplied in step ST3 may include, e.g., a monosilane gas, a disilane gas or the aforementioned aminosilane-based gas. The raw gas is supplied into the vessel 12 at a flow rate of, e.g., from 50 sccm to 5000 sccm. In step ST3, the internal pressure of the vessel 12 is set at a pressure of, e.g., from 0.1 Torr (13.33 Pa) to 10 Torr (1333 Pa). The internal temperature of the vessel 12 is set at a temperature of, e.g., from 300 degrees C. to 700 degrees C. When the monosilane gas is used as the raw gas, the internal temperature of the vessel 12 is set at, e.g., 530 degrees C. When the disilane gas is used as the raw gas, the internal temperature of the vessel 12 is set at, e.g., 400 degrees C.

In some embodiments—in step ST3, an additional gas containing one or more of a $C_2H_4$ gas, a $N_2O$ gas, a NO gas and a $NH_3$ gas may be supplied into the vessel 12. A flow rate of the additional gas may be set at, e.g., 5 sccm to 1000 sccm.

To perform step ST3 in the processing apparatus 10, the control unit 100 executes a control operation (a second control operation) to be described below. In this control operation, the control unit 100 controls the valve V21, the flow rate controller FC2 and the valve V22 so that the raw gas is supplied from the gas source GS2 into the vessel 12 at a specified flow rate. The control unit 100 controls the exhaust unit 42 to set the internal pressure of the vessel 12 at a predetermined pressure. The control unit 100 controls the heaters 30 to set the internal temperature of the vessel 12 at a predetermined temperature. When the additional gas is used in step ST3, the control unit 100 controls the valve V41, the flow rate controller FC4 and the valve V42 so that the raw gas can be supplied from the gas source GS4 into the vessel 12 at a specified flow rate.

Just like the first amorphous silicon film AF1, the second amorphous silicon film AF2 formed in step ST3 may contain an impurity. In some embodiments, the same process as step ST2 of implanting the impurity to the first amorphous silicon film AF1 may be applied to an implanting process of the impurity to the second amorphous silicon film AF2.

Subsequently, step ST4 is performed in the trench filling method. In step ST4, the wafers W are annealed. In Step ST4, the second amorphous silicon film AF2 is melted to flow toward the bottom portion of the trench GV. As a result, as shown in FIG. 2E, the bottom portion of the trench GV is filled with an amorphous silicon (AS).

In step ST4, the internal temperature of the vessel 12 that accommodates the wafers W is set at a predetermined temperature. For example, the internal temperature of the vessel 12 is set at a temperature of from 300 degrees C. to 600 degrees C. In step ST4, the internal pressure of the vessel 12 is set at a predetermined pressure. In one embodiment, the internal pressure of the vessel 12 in step ST4 may be set lower than the internal pressure of the vessel 12 in step ST3. Specifically, the internal pressure of the vessel 12 in step ST4 may be set at 1 Torr (133.3 Pa) or less, and in some embodiments, at $5 \times 10^{-5}$ Torr (0.00666 Pa). Further, in some embodiments, in step ST4, an inert gas such as a hydrogen gas or a nitrogen gas may be supplied into the vessel 12.

To perform step ST4 in the processing apparatus 10, the control unit 100 executes a control operation (a third control operation) to be described below. In this control operation, the control unit 100 controls the exhaust unit 42 to set the internal pressure of the vessel 12 at a predetermined pressure. The control unit 100 controls the heaters 30 so that the internal temperature of the vessel 12 can be set at a predetermined temperature. Further, the control unit 100 controls the valve V51, the flow rate controller FC5 and the valve V52 so that an inert gas can be supplied from the gas source GS5 into the vessel 12 at a specified flow rate.

In the trench filling method, the first amorphous silicon film AF1 is formed between the wall surfaces defining the trench GV and the second amorphous silicon film AF2. This alleviates a difference in stress caused between the second amorphous silicon film AF2 and an underlayer thereof The first amorphous silicon film AF1 is superior in surface flatness to the polycrystalline silicon film. Moreover, the first amorphous silicon film AF1 contains the impurity. Thus, the crystallization of silicon within the first amorphous silicon film AF1 is suppressed. In addition, as compared with the polycrystalline silicon film, the first amorphous silicon film AF1 containing the impurity can grow at a lower temperature. Accordingly, it is possible to reduce the thermal hysteresis applied to the wafers W, thus reducing the stress generated in the first amorphous silicon film AF1. Therefore, according to the trench filling method, the agglomeration of silicon in the second amorphous silicon film AF2 is suppressed during the annealing process in step ST4. Thus, the silicon can flow to the bottom portion of the trench GV. This suppresses the generation of cavities such as voids or seams.

In one embodiment, the internal pressure of the vessel 12 during the annealing process of step ST4 is set lower than the internal pressure of the vessel 12 during the film forming process of step ST3. In general, a relatively high pressure condition is applied to flow the silicon of the amorphous silicon film. Under the high pressure condition, the temperature of the wafers W needs to be set high. However, if the temperature of the wafers W is high, the silicon is crystallized, which causes a difference between the film stress of the underlayer and the film stress of the amorphous silicon film, thus resulting in migration of silicon. The flow of the amorphous silicon requires reducing the temperature of the wafers W. Thus, in one embodiment, the internal pressure of the vessel 12 during the annealing process of step ST4 is set lower than the internal pressure of the vessel 12 during the film forming process of step ST3, and the annealing temperature of the wafers W is set low. Therefore, during the annealing process of step ST4, the silicon in the second amorphous silicon film AF2 can be flown into the trench GV. If the internal pressure of the vessel 12 is set low, hydrogen contained in the second amorphous silicon film AF2 can be withdrawn even at relatively low temperatures. As a result, the fluidity of silicon of the second amorphous silicon film AF2 becomes higher. Therefore, according to the method of the present embodiment, it is possible to further suppress the generation of cavities such as voids or seams.

According to one embodiment, the seed layer SF is formed in step ST1. By forming the seed layer SF, it becomes possible to reduce the surface energy in the interface between the seed layer SF and the first amorphous silicon film AF1. This enhances the flatness of the first amorphous silicon film AF1.

According to one embodiment, in at least one of steps ST2 and ST3, a $N_2O$ gas or an ethylene gas is further supplied into the vessel 12. According to this embodiment, it becomes possible to suppress the crystallization of silicon and to reduce a grain size.

As mentioned above, according to the above embodiments of the present disclosure, it is possible to suppress the generation of cavities when filling trenches.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for filling a trench formed on an insulating film of a workpiece, the method comprising:
    forming a first impurity-containing amorphous silicon film on a wall surface which defines the trench;
    forming a second amorphous silicon film on the first amorphous silicon film; and
    filling the trench with an amorphous silicon by melting the second amorphous silicon film to flow toward a bottom portion of the trench, by annealing the workpiece after the second amorphous silicon film is formed with the first impurity-containing amorphous silicon film intact on the wall surface.

2. The method of claim 1, wherein forming a first impurity-containing amorphous silicon film, forming a second amorphous silicon film and annealing the workpiece are performed within a vessel of a processing apparatus, and
    wherein an internal pressure of the vessel in the annealing the workpiece is lower than an internal pressure of the vessel in the forming the second amorphous silicon film.

3. The method of claim 1, further comprising:
    forming a seed layer having an aminosilane-based gas or a high-order silane gas on the wall surface which defines the trench, the first amorphous silicon film being formed on the seed layer.

4. The method of claim 1, wherein, forming a first impurity-containing amorphous silicon film comprises supplying a silicon raw gas and one or more of a $C_2H_4$ gas, a $N_2O$ gas, a NO gas and a $NH_3$ gas.

5. The method of claim 1, wherein forming the first impurity-containing amorphous silicon film, forming the second amorphous silicon film, and annealing the workpiece are performed inside a vessel of a processing apparatus, and
    wherein a temperature of the vessel in annealing the workpiece is set at 300 degrees C. to 600 degrees C.

* * * * *